United States Patent
Patel (12)

(10) Patent No.: US 10,790,167 B2
(45) Date of Patent: Sep. 29, 2020

(54) NODULE RATIOS FOR TARGETED ENHANCED CLEANING PERFORMANCE

(71) Applicant: ENTEGRIS, INC., Billerica, MA (US)

(72) Inventor: Chintan Patel, Tyngsboro, MA (US)

(73) Assignee: ENTEGRIS, INC., Billerica, MA (US)

( * ) Notice: Subject to any disclaimer, the term of this patent is extended or adjusted under 35 U.S.C. 154(b) by 277 days.

(21) Appl. No.: 15/120,553

(22) PCT Filed: Feb. 20, 2015

(86) PCT No.: PCT/US2015/016949
§ 371 (c)(1),
(2) Date: Aug. 22, 2016

(87) PCT Pub. No.: WO2015/127301
PCT Pub. Date: Aug. 27, 2015

(65) Prior Publication Data
US 2017/0018422 A1 Jan. 19, 2017

Related U.S. Application Data

(60) Provisional application No. 61/942,231, filed on Feb. 20, 2014.

(51) Int. Cl.
*H01L 21/67* (2006.01)
*B08B 1/04* (2006.01)
(Continued)

(52) U.S. Cl.
CPC ........ *H01L 21/67046* (2013.01); *B08B 1/002* (2013.01); *B08B 1/04* (2013.01);
(Continued)

(58) Field of Classification Search
CPC .......... B08B 1/00; B08B 1/001; B08B 1/002; B08B 1/04; H01L 21/67046
(Continued)

(56) References Cited

U.S. PATENT DOCUMENTS

| 4,098,728 A | 7/1978 | Rosenblatt | |
|---|---|---|---|
| 6,299,698 B1 * | 10/2001 | Emami | B08B 1/04 134/6 |

(Continued)

FOREIGN PATENT DOCUMENTS

| EP | 937509 | * 8/1999 |
|---|---|---|
| JP | S596974 A | 1/1984 |

(Continued)

*Primary Examiner* — Mark Spisich
(74) *Attorney, Agent, or Firm* — Entegris, Inc.

(57) ABSTRACT

A foam brush that has nodules on an outer diameter surface of the brush that have a pitch to diameter ratio (P/D) of between 1.2 and 1.5 and a nodule height to nodule diameter ratio of 0.2 to 0.5 can be used to achieve improved small particle and organic residue removal from substrates following CMP processing. CMP cleaning brushes of the disclosure may also be prepared with foams that are relatively soft and have a compression strength of less than 90 grams/cm$^2$. CMP cleaning brushes with such P/D and H/D ratios, and optionally a compression strength of less than 90 grams/cm$^2$ can be used in a variety of CMP cleaning processes including post copper CMP processes.

8 Claims, 1 Drawing Sheet

(51) Int. Cl.
    *B08B 1/00*     (2006.01)
    *H01L 21/02*     (2006.01)
    *B24B 37/34*     (2012.01)

(52) U.S. Cl.
    CPC ........ *B24B 37/34* (2013.01); *H01L 21/02074* (2013.01); *H01L 21/02096* (2013.01)

(58) Field of Classification Search
    USPC ....... 15/21.1, 77, 88.2, 88.3, 97.1, 102, 179, 15/230, 16, 244.1, 244.4
    See application file for complete search history.

(56) References Cited

U.S. PATENT DOCUMENTS

| | | | |
|---|---|---|---|
| 6,502,273 B1* | 1/2003 | Mihara | B08B 1/04 15/102 |
| 6,793,612 B1* | 9/2004 | Cercone | B08B 3/08 15/102 |
| 7,984,526 B2 | 7/2011 | Benson | |
| 8,092,730 B2 | 1/2012 | Wargo et al. | |
| 2005/0109371 A1* | 5/2005 | Sin | B08B 1/04 134/6 |
| 2011/0265279 A1* | 11/2011 | Kawaguchi | A46B 9/005 15/244.4 |
| 2013/0048018 A1* | 2/2013 | Wargo | H01L 21/67046 134/6 |
| 2013/0255721 A1* | 10/2013 | Tyrrell | H01L 21/02096 134/6 |

FOREIGN PATENT DOCUMENTS

| | | |
|---|---|---|
| JP | H03-155551 A | 7/1991 |
| JP | H10-034091 A | 2/1998 |
| JP | 2000246187 A | 9/2000 |
| JP | 2000-270929 A | 10/2000 |
| JP | 2001-358110 A | 12/2001 |
| JP | 2004-298767 A | 10/2004 |
| JP | 2009066527 A | 4/2009 |
| JP | 2009-117765 A | 5/2009 |
| JP | 2009-283721 A | 12/2009 |
| JP | 2011-181644 A | 9/2011 |
| WO | 2010132329 A1 | 11/2010 |
| WO | 2011/103538 * | 8/2011 |
| WO | 2013/049207 A2 | 4/2013 |

* cited by examiner

NODULE RATIOS FOR TARGETED ENHANCED CLEANING PERFORMANCE

RELATED APPLICATIONS

This application is a National Phase entry of PCT Application No. PCT/US2015/016949, filed Feb. 20, 2015, which claims the benefit of U.S. Provisional Patent Application No. 61/942,231, filed Feb. 20, 2014, the disclosures of which are hereby incorporated by reference herein in their entireties.

FIELD OF THE INVENTION

The present invention is generally directed to chemical mechanical polishing of substrates. More specifically, the present invention is directed to a brush for cleaning substrates following chemical mechanical polishing.

BACKGROUND OF THE INVENTION

In the fabrication of semiconductor devices, there is a need to perform chemical mechanical polishing (CMP) operations and wafer cleaning. Typically, integrated circuit devices are in the form of multi-level structures. At the wafer level, transistor devices having diffusion regions are formed. In subsequent levels, metal interconnect lines are patterned and electrically connected to the transistor devices to define the desired functional device. As is well known, patterned conductive layers are insulated from other conductive layers by dielectric materials, such as silicon dioxide. As more metallization levels and associated dielectric layers are formed, the need to planarize the dielectric material grows. Without planarization, fabrication of further interconnect and dielectric layers becomes substantially more difficult due to the higher variations in the surface topography. In semiconductor manufacturing processes, metal interconnect patterns are formed in a dielectric material on a wafer, and then, chemical mechanical planarization, CMP, operations are performed to remove the excess metal. After any such CMP operation, it is necessary that the planarized wafer be cleaned to remove particulates and contaminants.

In the manufacture of electronic devices such as integrated circuits, the presence of particulate contamination, trace metals, and mobile ions on a wafer is a serious problem. Particulate contamination can cause a wide variety of problems such as localized corrosion, scratching, and "shorts" in the integrated circuit. Mobile ion and trace metal contaminants can also lead to reliability and functional problems in the integrated circuit. The combination of these factors results in lower device yields on a wafer, thereby increasing the cost of an average functional device on the wafer. Each wafer, being at different stages of fabrication, represents a significant investment in terms of raw materials, equipment fabrication time, and associated research and development.

Chemical-mechanical polishing ("CMP") is a commonly used technique for planarizing a film on the wafer prior to subsequent processing of the wafer. CMP usually involves the introduction of a polishing slurry having 50-100 nanometer sized abrasive particles onto the surface of a polishing pad. The wafer with the layer of material, dielectric or metal, to be removed is placed against the surface of a polishing pad with the slurry. Rotating the wafer against the rotating polishing pad decreases the thickness of the layer through a combination of chemical and mechanical actions. The slurries typically are water based and can include fine abrasive particles such as silica, alumina, and other metal oxide abrasive materials. After polishing is complete, the processed wafers must be cleaned to completely remove residual slurry and other residue from the polishing process. The surface is the ready for other processing steps such as electrochemical deposition, etching, and photolithography.

To clean residual slurry material from the surface of the polished surface, especially particles less than 0.1 microns in diameter, cleaning brushes are commonly used. These cleaning brushes are usually cylindrical in shape and are rotated along a center axis of the brush. The cleaning brushes are also often made of a foam or porous polymeric material such as polyvinyl alcohol ("PVA"). Such brushes may be injection molded, such as described in U.S. Pat. No. 8,460,475, owned by the owner of the instant application and incorporated herein by reference for all purposes.

To perform the cleaning operations in an automated manner, fabrication labs employ cleaning systems. The cleaning systems typically include one or more brush boxes in which wafers are scrubbed. Each brush box includes a pair of brushes, such that each brush scrubs a respective side of a wafer. To enhance the cleaning ability of such brush boxes, it is common practice to deliver cleaning fluids through the brush (TTB). TTB fluid delivery is accomplished by implementing brush cores that have a plurality of holes that allow fluids being fed into the brush core at a particular pressure to be released onto the substrate surface. The fluid is distributed from the brush core through the polymeric material and onto the substrate surface.

The combination of rotational movement of the brush and force or pressure placed on the brush against the wafer as well as the application of cleaning fluids or deionized water causes residual slurry materials to be removed from the surface of the wafer.

These brushes have protrusion or nodes on their surface for contact and material removal from a substrate. Brushes are formed as sleeves and are slid over a core support which is used to deliver fluids to the brush and to rotate the brush.

As semiconductor feature sizes decrease and device performance requirements continue increase, cleaning engineers are also challenged to improve their associated processes. At advanced semiconductor manufacturing nodes, effectiveness of particle removal and organic residue removal from substrates like wafers and flat panel displays following chemical mechanical planarization (CMP) processes are constantly being tested with parameters and materials being adjusted to improve to meet the advanced node cleanliness requirement for removing smaller slurry particles and corrosion inhibitor additives from the polished substrates to below target contamination control levels. For example, in the copper CMP process, organic residues for example that are related but not limited to Benzotriazole (BTA), can become adsorbed on copper surfaces after Cu CMP processing. It is advantageous to remove the BTA residue by brush cleaning before further process occurs. X-ray photoelectron spectroscopy (XPS) can be used to detect BTA on copper and copper oxide surfaces. The area under the XPS nitrogen 1s line (N 1s line) can be used to determine the presence and amount or relative amount of BTA on a surface and the Cu 2p3/2 line can be used to indicate the presence of copper oxide. Decreasing area under the N 1s line for a series of XPS spectra following brush cleanings on a substrate with BTA can be used to indicate that BTA is being removed from the substrate. The area under the XPS N1s line can be used to compare amounts of BTA on different substrates following cleaning. Other techniques that can be used to detect BTA on copper substrates include Fourier Transform Infrared Spectroscopy, contact angle of a liquid drop on the surface, and Auger electron spectroscopy. Thus, by measuring remaining organic residues, users of such brushes are able to gauge effectiveness of process tweaks.

SUMMARY OF THE INVENTION

While efforts of optimization have focused on adjusting process parameters and materials, optimization of parameters relating to the physical structure of the brush such as nodule size, shape, aspect ratios, and densities, and such parameters in combination with one another appears to not have been addressed. In embodiments of the invention a cylindrical foam brush having a nodule pitch to nodule diameter ratio (P/D) of between 1.2 and 1.5 and a nodule height to nodule diameter ratio of 0.2 to 0.5.

In an embodiment of the invention, a cylindrical foam brush has a plurality of nodules with a row of elongate nodules at each of two ends and uniformly shaped nodules therebetween, the uniform shaped nodules therebetween having a nodule pitch to nodule diameter ratio (P/D) of between 1.2 and 1.5 and a nodule height to nodule diameter ratio of 0.2 to 0.5.

In an embodiment of the invention, a cylindrical foam brush has a plurality of nodules with a row of elongate nodules at each of two ends and uniformly shaped nodules therebetween, the uniform shaped nodules therebetween having a nodule pitch to nodule diameter ratio (P/D) of between 1.2 and 1.5 and a nodule height to nodule diameter ratio of 0.2 to 0.5.

An advantage of the invention is that improved small particle and organic residue removal from substrates following CMP processing is provided. In embodiments the CMP cleaning brushes can be made of a low compression strength foam. A feature and advantage of embodiments is that such CMP cleaning brushes can be used and are effective in a variety of CMP cleaning processes, including post copper CMP processes, to remove small particles and organics from polished substrates.

DETAILED DESCRIPTION

Figure 1:
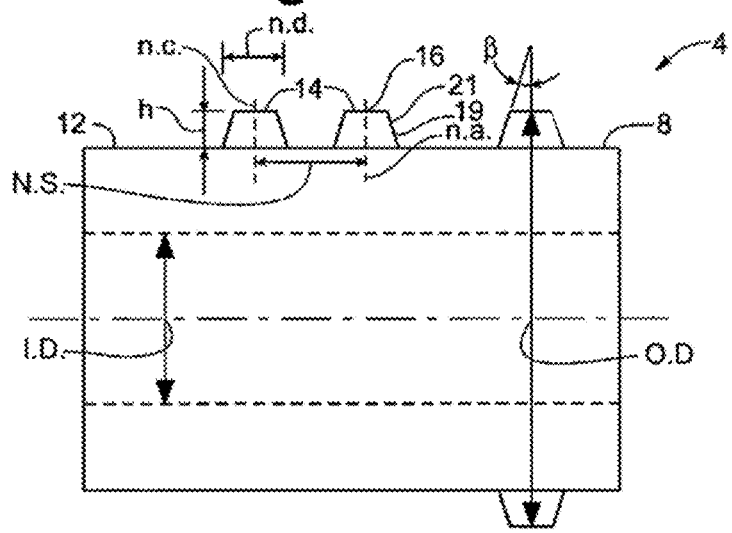
FIG. 1 illustrates various dimensions and features on a post CMP cleaning brush.
Figure 2:
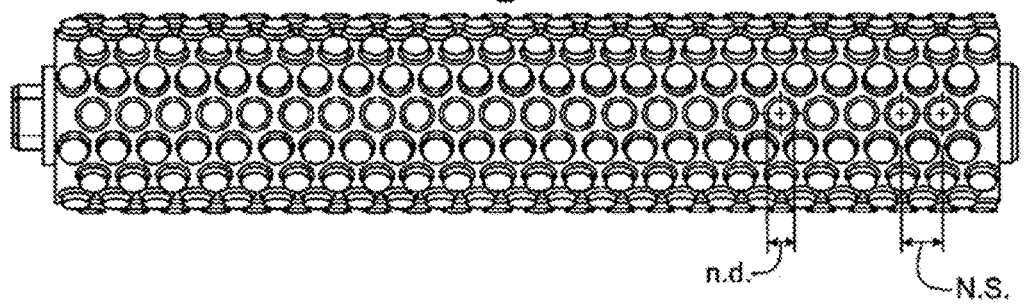
FIG. 2 is a side elevation view of a brush in accord with the inventions herein.

Referring to FIG. 1, a CMP cleaning brush 4 is shown and has a base 8 with an outer surface 12 and a plurality of nodules 14. Each nodule has an outward face 16 and a side wall 19 with a side wall surface 21. The outward face is generally planar but may have a slight convex shape. Each nodule has a height h, a nodule axis n.a., a nodule center n.c., and nodule diameter n.d. The nodules are arranged such that each nodule has adjacent nodules, defining nodule spacing (N.S.) or "pitch" between the centers of adjacent nodules. Where adjacent nodules have different spacings with respect to a nodule, the pitch then is the distance between centers of the closest adjacent nodule. The brush has an inside diameter (ID) and outside diameter (OD). The nodules may have a slight taper from adjacent the base to the top of the nodule, see the taper angle β or angle of variation from cylindrical Referring to FIG. 2, an embodiment with uniformly shaped and spaced nodules that may be substantially cylindrical. "Substantially cylindrical" is defined where the diameter varies less than 20% through the length of the nodule.

Figure 3:
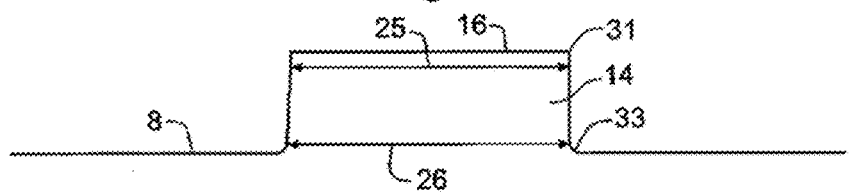
FIG. 3 is a detail side elevational view of a nodule.

Referring to FIGS. 1 and 3, where there is a taper in the nodule, the nodule diameter n.d., is defined as the mean of the lesser diameter 25 and the greater diameter 26; with the measurement taken adjacent the top face just below any radiused corner 31 at the top of the nodule and any radiused corner 33 at the bottom of the nodule. Herein "top" implies radially outward, and bottom or lower implies radially inward.

Table 1 below shows the results of measurements of the pitch, height, and diameter of brush nodules using two different methods. The results show that the two techniques are comparable for similar brushes, for example brush C1 measured by the laser camera had a P/D ratio of 1.47 and an H/D ratio of 0.64; a measurement made using a visual technique gave a P/D ratio of 1.44 and an H/D ratio of 0.64. A letter designation for several test brushes, the P/D or H/D ratio, and reported relative qualitative representation of BTA removal by the brush from substrates (poor, fair, good, very good).

TABLE 1

| Module Measurement Method | Brush | Pitch to diameter ratio (P/D) or Height to diameter (H/D) ratio | | Relative BTA removal (from copper substrate) performance of brush |
|---|---|---|---|---|
| Laser Camera | A | P/D | 1.80 | Poor |
|  |  | H/D | 0.6 |  |
| Laser Camera | B1 | P/D | 1.41 | Very good |
|  |  | H/D | 0.36 |  |
| Laser Camera | B2 | P/D | 1.47 | Very good |
|  |  | H/D | 0.35 |  |
| Laser Camera | C1 | P/D | 1.47 | Good |
|  |  | H/D | 0.66 |  |
| Laser Camera | D | P/D | 1.70 | Poor |
|  |  | H/D | 0.54 |  |
| Visual measurement | E | P/D | 1.60 | Poor |
|  |  | H/D | 0.70 |  |
| Visual measurement | F | P/D | 1.56 | Good |
|  |  | H/D | 0.54 |  |
| Visual measurement | C2 | P/D | 1.44 | Good |
|  |  | H/D | 0.64 |  |
| Visual measurement | G | P/D | 1.59 | Fair |
|  |  | H/D | 0.55 |  |

The pitch P, which is the center to center spacing of the nodules on the brush, can range from 5 millimeters, or about 5 millimeters, to 22 millimeters or about 22 millimeters. Some brushes have nodules in rows where the different rows are disposed at spaced, radial locations about the longitudinal axis of the cylindrical body such that projections of one row are disposed at intervals to define an angle of 22.5° between radial lines extending through the central axes of adjacent offset nodules. This 22.5° angle gives 16 nodules around the circumference. Other angles and numbers of nodules about the brush circumference are also possible. The height of the nodules can be measured from the base of the nodule to its top most surface and nodule heights can range from 2 millimeters, or about 2 millimeters, to 8 millimeters or about 8 millimeters. The diameter of the nodules can range from 4 millimeters, or about 4 millimeters, to 15 millimeters or about 15 millimeters. The diameter of nodules on a brush can be the same or the nodules on the brush can have different diameters; the height of nodules on a brush are all substantially the same; the pitch between nodules on a brush can be the same or different. If different, average pitches of the brush may be used to conform to the inventions herein.

Some representative combinations of nodule diameter, nodule to nodule pitch, and nodule height, that fall in the nodule pitch to nodule diameter ratio range (P/D) of between 1.2 and 1.5 and the nodule height to nodule diameter ratio range of 0.2 to 0.5 are illustrated in the Table 2 below. Without limitation, other combinations of nodule diameter, nodule to nodule pitch, and nodule height not listed in Table 2 can also be used in versions of the brush.

TABLE 2

| Diameter (mm) | Pitch (mm) | Height (mm) |
| --- | --- | --- |
| 4 | 4.8 | 2 |
| 4.5 | 5.8 | 2 |
| 5 | 7.25 | 2.5 |
| 6 | 8.7 | 3 |
| 7 | 10.15 | 3.5 |
| 8 | 11.6 | 4 |
| 8 | 10 | 2 |
| 9 | 13.05 | 4.5 |
| 10 | 14.5 | 5 |
| 11 | 15.95 | 5.5 |
| 12 | 17.4 | 6 |
| 13 | 18.85 | 6.5 |
| 14 | 20.3 | 7 |
| 14 | 21 | 5 |
| 15 | 21.75 | 7.5 |

Brush outside diameter can be determined by measuring the distance from the central rotational axis of the brush to the top surface of a nodule and multiplying by two—this can be used to determine an effective outside diameter of the brush even for brushes where nodules are not positioned opposite each other on the brush. In some versions the outside diameter of the brush or the effective outside diameter of the brush can range from 40 millimeters to 70 millimeters.

Nodule pitch to nodule diameter ratio (P/D) of brush can range from 1.2 to 1.5. If P/D is less than 1.2 there is a high risk of scratching the substrate because there is little room between nodules for particles to escape from under the brush nodules. If P/D is greater than 1.5, there is a risk that there will not be sufficient contact area to clean efficiently because there is greater free space on the brush without nodules.

Nodule height to nodule diameter ratio (H/D) of brush can range from 0.2 to 0.5. If H/D is less than 0.2, essentially more stubby than 0.2 to 0.5, the stress on the wafer from the brush nodule can be greater which can lead to substrate damage. If the P/D ratio is greater than 0.5, less shear force will be applied by the nodules to the substrate thereby reducing cleaning efficiency.

In some versions the P/D ratio can be substituted by a P/A (pitch to contact area) ratio and likewise the H/D ratio substituted by an H/A (height to contact area) ratio. Nodules in some versions can be substantially cylindrical in cross section, for example the diameter varies by less than ±20% depending upon where the measurement is taken on a given nodule or set of nodules. The diameter of the external face of the nodule compared to the diameter at the end of the conical section of the nodule, where the nodule transitions to the cylindrical base. In some versions of conical nodules, the diameter can be taken at the top of the nodule. The pitch, height, and diameter measurement of nodules can be an average made on 10 or more nodules. For irregularly shaped nodules, asymmetrically shaped nodules, the diameter of a circle that circumscribes the irregularly shaped nodule can be used for the diameter. In brush configurations, such as illustrated in U.S. Publication US 2013/0048018, incorporated by reference herein, asymmetrically shaped nodules are illustrated.

The pitch or spacing between adjacent nodules can be measured from the center to center of adjacent nodules, usually nodules in the same row, but nodules may be in a spiral or other configuration. The nodules can be in the shape of a cylinder or other geometric shape such as a truncated cone. For irregularly shaped nodules, for example but not limited to those disclosed in International Patent Application No. PCT/US2012/057337, Patel, titled "Post-CMP Cleaning Apparatus and method, filed Sep. 26, 2012 and incorporated herein by reference in its entirety, the approximate center of mass of a cross section can be used to estimate the center of a nodule. The height of the nodule can be measured from its top most surface 16 or point to the outer surface 12 of the brush base as illustrated in FIG. 1.

In some versions, the CMP brush has an unbalanced nodule configuration, such as about the center region of the brush or wafer, or as otherwise disclosed in U.S. Patent Publication No. US2013/0048018, incorporated herein by reference in its entirety. In some versions of a CMP Brush comprising a low compression foam and an unbalanced nodule configuration, the nodules on one side of the brush can have a first or first set of P/D and H/D ratio(s) while nodules on the other side of the center region can have a second or second set of P/D and H/D ratio(s); the first and second set of P/D and H/D ratios can be the same or different and both sets fall within the nodule pitch to nodule diameter ratio (P/D) range of between 1.2 and 1.5 and the nodule height to nodule diameter ratio (H/D) range of 0.2 to 0.5.

The compressive strength of the foam comprising the brush can be from 60 grams/centimeter squared to 90 grams/centimeter squared. A CMP cleaning brush having a compression strength of from 60 grams/centimeter squared to 90 grams/centimeter squared is considered to be a relatively soft brush when compared to brushes that have a foam compression strength of greater than 90 g/cm$^2$. In some versions the brushes have a foam with a compression strength of 90 grams/centimeter squared or less. Softer brushes are advantageous in reducing scratches on substrates caused by slurry particle trapped between nodule tops and the substrate, but lower compression strength can reduce brush cleaning efficiency for removing particles and organics like BTA from a substrate.

Higher force between the brush and substrate is utilized to remove small particles and organics from substrates such as but not limited to wafers following copper CMP. A brush with a nodule P/D ratio of from 1.2 to 1.5 and nodule H/D ratio of from 0.2 to 0.5 shows qualitative improvement in cleaning especially with low compression brush foams.

Brushes can be made for example using the teachings of U.S. Pat. No. 7,984,526, Benson, filed 16, Aug. 2006, and U.S. Pat. No. 8,092,730, Wargo, et al, filed Nov. 21, 2006, the contents of these incorporated herein by reference in their entirety. Brushes can also be made using the teachings of U.S. Pat. No. 4,098,728, Rosenblatt, filed Jan. 2, 1976, and U.S. Pat. No. 6,793,612, filed Mar. 24, 2000, the teachings of these incorporated herein by reference in their entirety.

Figure 4:
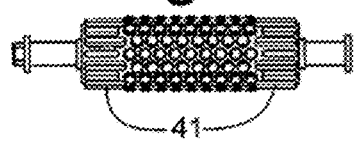
FIG. 4 is a brush with rows of elongate nodules at the ends of the brush base.

Referring to FIG. 4, the brush can have one or two circumferential rows 41 of elongate nodules on one end or on both ends as provided by US 2013/0048018, incorporated by reference herein.

Brush foam can be PVA (polyvinyl alcohol), polyvinyl acetal, polyurethane, or other materials used to make foam brushes for CMP cleaning.

Compression can be determined by slicing a ring (cross section) sample of the brush, compressing it to 30% of the original height of the ring sample using an Instron, and recording the force to achieve the 30% height compression. Results of brush compression can be reported in grams/cm$^2$.

These, and other, aspects of the invention will be better appreciated and understood when considered in conjunction with the foregoing description. The description, while indicating various embodiments or versions of the CMP brushes and CMP brush nodules as well as numerous specific details thereof, is given by way of illustration and not of limitation. Many substitutions, modifications, additions or rearrangements may be made within the scope of the invention, and the invention includes all such substitutions, modifications, additions or rearrangements.

The nodule attributes disclosed in U.S. Pat. No. 6,793,612 col. 3, lines 30-65, can be used to illustrate brush and nodule configurations that lie outside of the brushes described herein. For example, the nodules of U.S. Pat. No. 6,793,612 col. 3, lines 30-65 have a nodule height of about 0.1875 inches (0.476 cm), and a diameter of 0.31 inches (0.78 cm). The nodules are disposed at intervals to define an angle of 22.5 between radial lines extending through the projections which would give 16 projection around the diameter of the brush. In the hypothetical case of a 7 centimeter outside diameter brush with the above nodules, the brush radius would be 3.5 cm and the pitch between nodules calculated to be (2*3.145*(3.5))/16 or 1.37 cm. For a hypothetical 4 centimeter outside diameter brush with the same nodules the pitch would be 0.78 cm between nodules. For the hypothetical 7 cm OD brush, the P/D ratio would be (1.37/0.78=1.76) and the H/D ratio would be (0.476/0.78=0.61); for the hypothetical 4 cm OD brush the P/D ratio would be (0.78/0.78=1) and the H/D ratio would be (0.476/0.78=0.61). Neither the hypothetical 7 cm outside diameter brush nor the hypothetical 4 cm outside diameter brush with the nodules of U.S. Pat. No. 6,793,612 col. 3, lines 30-65 would have BOTH a pitch to diameter ratio (P/D) of between 1.2 and 1.5 and a nodule height to nodule diameter ratio of 0.2 to 0.5.

While various compositions and methods are described, it is to be understood that this invention is not limited to the particular molecules, compositions, designs, methodologies or protocols described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to an "nodule" is a reference to one or more nodules and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of embodiments of the present invention. All publications mentioned herein are incorporated by reference in their entirety. Nothing herein is to be construed as an admission that the invention is not entitled to antedate such disclosure by virtue of prior invention. "Optional" or "optionally" means that the subsequently described event or circumstance may or may not occur, and that the description includes instances where the event occurs and instances where it does not. All numeric values herein can be modified by the term "about," whether or not explicitly indicated. The term "about" generally refers to a range of numbers that one of skill in the art would consider equivalent to the recited value (i.e., having the same function or result). In some embodiments the term "about" refers to ±10% of the stated value, in other embodiments the term "about" refers to ±2% of the stated value. While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed or closed member groups.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Although the present invention has been described in considerable detail with reference to certain embodiments thereof, other versions are possible. Therefore the spirit and scope of the appended claims should not be limited to the description and the versions contain within this specification.

What is claimed is:

1. A brush for cleaning wafers after a CMP process, wherein the brush is formed from a foam material and wherein the brush is cylindrical comprising a base with a rotational axis and a plurality of uniformly shaped and spaced nodules extending outwardly from the base, each nodule having a center, a nodule height, and a nodule diameter, the brush nodules having an average nodule pitch to nodule diameter ratio (P/D) of between 1.2 and 1.5 and a nodule height to nodule diameter ratio (H/D) of 0.2 to 0.5, wherein the nodule height of each nodule is in a range of from 6 mm to 7.5 mm, the nodule diameter of each nodule is in a range of from 12 mm to 15 mm, and the nodule pitch measured from the center of adjacent nodules is in a range of from 17.4 mm and 21.75 mm.

2. The brush as in claim 1, where the compression strength of the brush foam is less than 90 g/cm$^2$.

3. The brush of claim 1, where the compression strength of the brush foam is between 60 grams/centimeter squared and 90 g/cm$^2$.

4. The brush of claim 1, wherein the foam material is comprised of one of polyvinyl alcohol, polyvinyl acetal, and polyurethane.

5. The brush of claim 1, wherein each nodule is substantially cylindrically shaped.

6. The brush of claim 1, wherein the brush has two ends and at least one of the two ends comprises a circumferential row of elongate nodules.

7. The brush of claim 1, wherein a plane perpendicular to the rotational axis of the brush divides the brush into a first side and a second side, and wherein the nodule configuration on the first side of the brush is different from the nodule configuration on the second side of the brush.

8. The brush of claim 1, wherein the outside diameter of the brush is from 40 mm to 70 mm.

* * * * *